(12) United States Patent
Meyer, III

(10) Patent No.: US 8,334,670 B2
(45) Date of Patent: Dec. 18, 2012

(54) METHOD AND APPARATUS TO MONITOR AN ELECTRIC MOTOR CONTROL CIRCUIT

(75) Inventor: John William Meyer, III, Fishers, IN (US)

(73) Assignee: GM Global Technology Operations LLC, Detroit, MI (US)

( * ) Notice: Subject to any disclaimer, the term of this patent is extended or adjusted under 35 U.S.C. 154(b) by 348 days.

(21) Appl. No.: 12/731,391

(22) Filed: Mar. 25, 2010

(65) Prior Publication Data

US 2011/0234126 A1     Sep. 29, 2011

(51) Int. Cl.
*H02P 27/04* (2006.01)
*H02P 27/00* (2006.01)

(52) U.S. Cl. ............. 318/801; 318/807; 361/33; 361/43

(58) Field of Classification Search .................. 318/801, 318/807, 727; 361/23, 33, 42; 363/39, 89
See application file for complete search history.

(56) References Cited

U.S. PATENT DOCUMENTS

| | | | | |
|---|---|---|---|---|
| 3,947,748 A * | 3/1976 | Klein | ............................. | 363/57 |
| 5,877,926 A | 3/1999 | Moisin | | |
| 5,883,489 A * | 3/1999 | Konrad | ......................... | 318/807 |
| 5,945,802 A * | 8/1999 | Konrad et al. | ................ | 318/807 |
| 5,982,136 A * | 11/1999 | Pelly | ............................ | 318/801 |
| 6,700,214 B2 * | 3/2004 | Ulinski et al. | .............. | 290/40 C |
| 6,700,802 B2 * | 3/2004 | Ulinski et al. | .................. | 363/37 |
| 6,741,060 B2 * | 5/2004 | Krefta et al. | .................... | 318/727 |
| 6,801,019 B2 * | 10/2004 | Haydock et al. | ................ | 322/17 |
| 6,850,426 B2 * | 2/2005 | Kojori et al. | ................... | 363/123 |
| 6,879,053 B1 * | 4/2005 | Welches et al. | .................... | 290/6 |
| 6,969,922 B2 * | 11/2005 | Welches et al. | ............... | 290/1 A |
| 7,253,584 B2 | 8/2007 | Souther et al. | | |
| 7,479,756 B2 * | 1/2009 | Kasunich et al. | ............. | 318/732 |
| 2002/0041502 A1 * | 4/2002 | Ulinksi et al. | ................... | 363/37 |
| 2002/0051368 A1 * | 5/2002 | Ulinski et al. | ..................... | 363/1 |
| 2002/0145837 A1 * | 10/2002 | Krefta et al. | ..................... | 361/23 |
| 2003/0107349 A1 * | 6/2003 | Haydock et al. | ................ | 322/28 |
| 2003/0218887 A1 * | 11/2003 | Kojori et al. | ..................... | 363/16 |
| 2005/0140142 A1 * | 6/2005 | Welches et al. | ................... | 290/41 |
| 2005/0206230 A1 * | 9/2005 | Donnelly | ...................... | 303/139 |
| 2006/0202636 A1 * | 9/2006 | Schneider | ..................... | 315/291 |
| 2006/0220774 A1 | 10/2006 | Skendzic | | |
| 2006/0256488 A1 * | 11/2006 | Benzing et al. | ................. | 361/23 |
| 2007/0139835 A1 * | 6/2007 | Alfano et al. | .................... | 361/42 |
| 2007/0291426 A1 * | 12/2007 | Kasunich et al. | .............. | 361/33 |
| 2008/0136399 A1 * | 6/2008 | Alfano et al. | ................. | 323/301 |
| 2008/0298103 A1 * | 12/2008 | Bendre et al. | .................. | 363/89 |
| 2009/0184717 A1 | 7/2009 | Ivan et al. | | |
| 2010/0053901 A1 * | 3/2010 | Irving et al. | .................. | 361/707 |
| 2011/0218745 A1 * | 9/2011 | Hasan et al. | ..................... | 702/58 |
| 2012/0092906 A1 * | 4/2012 | Hasler | ............................. | 363/39 |

OTHER PUBLICATIONS

U.S. Appl. No. 12/718,016, filed Mar. 5, 2010, Hasan, et al.
Application Notes; Power Electronic Measurements, Ltd, Aug. 17, 2002.

* cited by examiner

*Primary Examiner* — Paul Ip

(57) ABSTRACT

An electric motor control circuit includes an electric energy storage device electrically connected via DC power buses to an inverter circuit that connects via an alternating current circuit to an electric machine. A capacitive shunt circuit connects between the power buses. Current flow through the capacitive shunt circuit to the chassis ground is monitored. A fault is identified when the current flow through the capacitive shunt circuit to the chassis ground exceeds a threshold.

17 Claims, 3 Drawing Sheets

METHOD AND APPARATUS TO MONITOR AN ELECTRIC MOTOR CONTROL CIRCUIT

TECHNICAL FIELD

This disclosure is related to electric motor control circuits, and more specifically to monitoring electric motor control circuits.

BACKGROUND

The statements in this section merely provide background information related to the present disclosure and may not constitute prior art.

Electric machines include rotors that rotate in response to alternating current (AC) electric power applied to associated stators. The rotors can be mechanically coupled to power transmission devices to provide tractive power to a driveline of a vehicle.

Known voltage source inverters including rectifier bridge circuits and associated control circuits can convert direct current (DC) electric power originating from a high-voltage energy storage device to alternating current (AC) electric power to generate tractive power in response to operator requests. Known rectifier bridge circuits include MOSFET and IGBT switch devices. Electric load requirements can include presently occurring electric loads and battery charging to meet future electric loads.

A voltage source inverter uses a floating DC bus setup wherein the DC input voltages are configured to float with reference to a chassis ground. This floating can be controlled by using high impedance resistors that connect to a chassis ground. Capacitors can be electrically connected in parallel with the high impedance resistors to provide low impedance shunt paths for high frequency electric noise currents. In one embodiment, half the DC bus voltage is applied across a positive electric power bus DC(+) to the chassis ground, and half the DC bus voltage is applied across a negative electric power bus DC(−) to the chassis ground. An AC side of the voltage source inverter floats with reference to the chassis ground, ideally having infinite resistance and zero capacitance.

When a ground isolation fault occurs on one of the phases of the AC side of the voltage source inverter, AC current associated with activation and deactivation of the switch devices of the inverter flows through the capacitors that provide the low impedance shunt paths for high frequency electric noise currents. In event of a ground isolation fault, AC current associated with one of the phase voltages of the inverters from the positive electric power bus DC(+) to the negative electric power bus DC(−) can cause excessive electric current flow to the capacitors that provide the low impedance shunt paths for high frequency electric noise currents. AC current in excess of the capacity of the capacitors can cause capacitor faults and associated inverter damage.

A known solution to detect and thus prevent a ground isolation fault includes measuring electric current through each of the electric cables associated with the phases of the AC side of the voltage source inverter and arithmetically summing them. In an ideal system operating without a fault, the sum of the measured electric currents is zero at any selected point in time. When a ground isolation fault is present, the sum of the measured electric currents is a value other than zero. Issues associated with this solution include measurement errors with signal outputs from the electric current sensing devices, which can be cumulative. This can cause an error in the overall current signal. Furthermore, a phase current sensor can have bandwidth/step response limitations due to magnetic and electrical response characteristics and sensor saturation. Thus a fault may not be detected depending on the timing of the sample measurement in relation to switching events associated with the inverter. Furthermore, a ground isolation fault and associated change in impedance can include a resonance element, with data sampling occurring at or near a zero crossing. Thus, any fault current may be aliased out. Furthermore, when impedance approaches zero, any current oscillation may be dampened out in less than the sampling time. Thus the fault current may not be measured.

Another known solution includes measuring voltage between the positive electric power bus DC (+) and the chassis ground, and measuring voltage between the negative electric power bus DC (−) and the chassis ground to detect a ground isolation fault. Issues associated with this known solution include measurement errors in the signals, which need to be accounted for and often are cumulative. Furthermore, known DC voltage sensors can have bandwidth and response time measurement limitations. Thus a fault may not be detected. Furthermore, the timing of the measurement sample relative to a fault and an associated switching event may result in a fault not being recorded. Furthermore, a fault impedance may include a resonance element, with data sampling occurring at or near the zero crossing. Thus, any fault current may be aliased out. Furthermore, when a switching period associated with the inverter is near a 50% duty cycle, an average voltage may still be near an expected level. Thus, a fault voltage may not be measured.

SUMMARY

An electric motor control circuit includes an electric energy storage device electrically connected via a positive DC electric power bus and a negative DC electric power bus to an inverter circuit. The inverter circuit is electrically connected via an alternating current circuit to an electric machine. A method to control the electric motor control circuit includes controlling the inverter circuit to control electric current flow between the alternating current circuit and the electric machine, continuously monitoring AC electric current flow through a capacitive shunt circuit electrically connected between the positive DC electric power bus and the negative DC electric power bus. The capacitive shunt circuit includes a node electrically coupled to a chassis ground. The method also includes detecting a fault associated with one of the alternating current circuit and the electric machine when the AC electric current flow through the capacitive shunt circuit exceeds a predetermined threshold, and controlling the inverter circuit to interrupt the flow of electric current between the alternating current circuit and the electric machine in response to a detected fault.

BRIEF DESCRIPTION OF THE DRAWINGS

One or more embodiments will now be described, by way of example, with reference to the accompanying drawings, in which.

DETAILED DESCRIPTION

Figure 1:
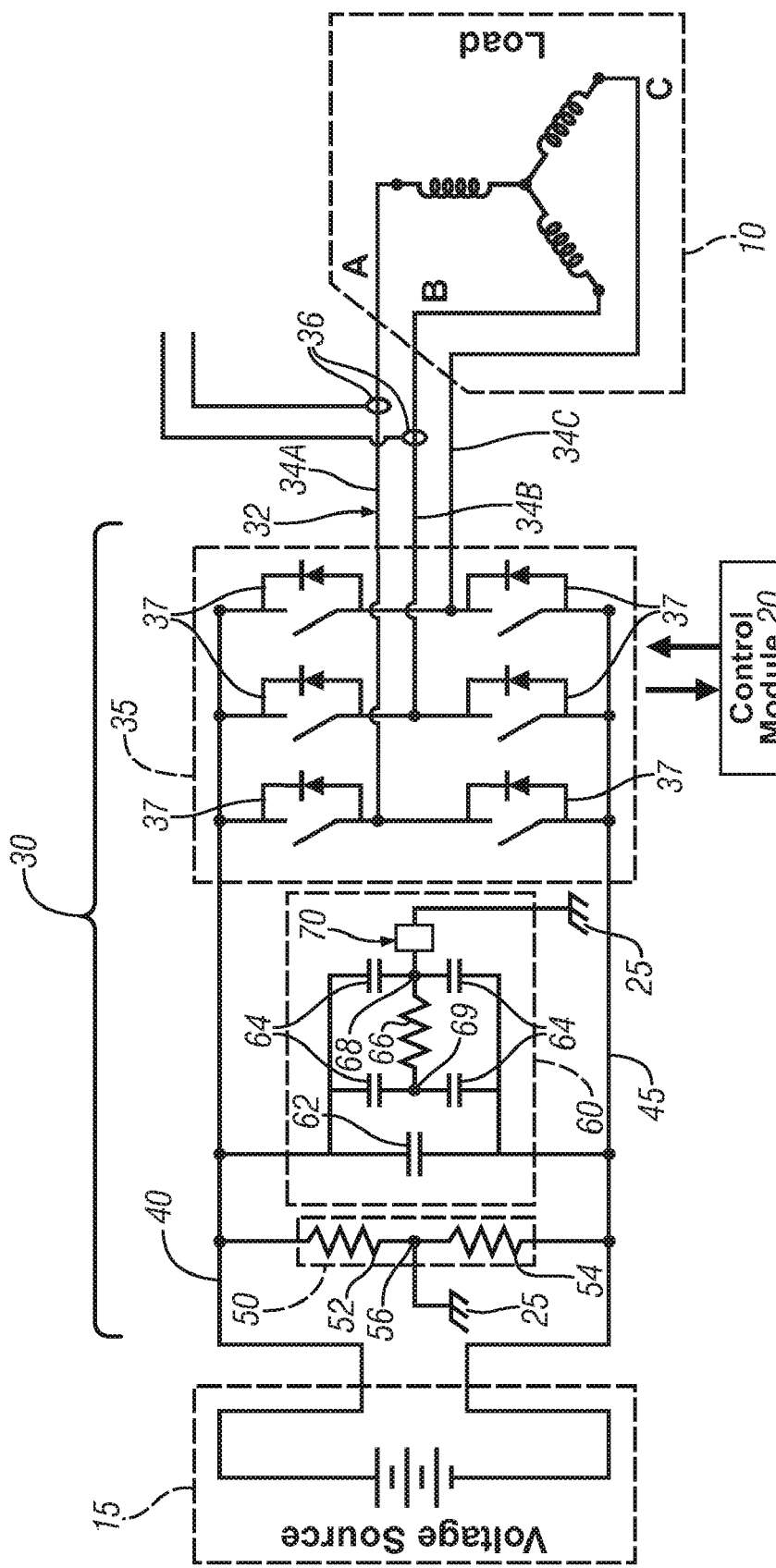
FIG. 1 schematically illustrates an electric motor control circuit including an inverter circuit configured to transfer and convert high-voltage direct-current (DC) electric power from a high-voltage energy storage device to high-voltage alternating current (AC) electric power that is transferred to an electric machine in accordance with the present disclosure.

Referring now to the drawings, wherein the showings are for the purpose of illustrating certain exemplary embodiments only and not for the purpose of limiting the same, FIG. 1 schematically illustrates an electric motor control circuit including an inverter circuit 30 configured to transfer and convert high-voltage direct-current (DC) electric power from a high-voltage energy storage device 15, e.g., a battery, to high-voltage alternating current (AC) electric power that is transferred to an electric machine 10. The high-voltage energy storage device 15 electrically connects to the inverter circuit 30 via a positive direct-current (DC) electric power bus 40 and a negative direct-current (DC) electric power bus 45. The inverter circuit 30 electrically connects to the electric machine 10 via an AC electric circuit 32 including a wiring harness including a plurality of electric cables 34A, 34B, and 34C, wherein the electric cables 34A, 34B, and 34C electrically connect to phases of the multiphase electric machine 10. Phase current sensors 36 are configured to sense and thus monitor electric current flowing through respective electric cables 34. In one embodiment, phase current sensors 36 monitor electric current through two of the three electric cables, e.g., cables 34A and 34B. In this embodiment, phase current through the third of the three electric cables, e.g., cable 34C, can be inferred based upon the phase current measured through cables 34A and 34B and an AC current transducer 70, described hereinbelow. Alternatively, phase current sensors 36 can monitor electric current through all three of the electric cables, e.g., cables 34A, 34B, and 34C.

The electric machine 10 preferably includes a multiphase synchronous AC machine including a stator and a rotor magnetically coupled to the stator. As depicted, the multiphase electric machine 10 is a three-phase machine with electric phases A, B, and C. Alternatively, the electric machine 10 can include any one of a plurality of multiphase devices, e.g., two-phase, four-phase, five-phase devices, and a half-phase electric machine. In one embodiment the electric machine 10 is configured to generate torque that is transferred via a rotor to a driveline for a vehicle.

The inverter circuit 30 includes a rectifying bridge circuit 35. The rectifying bridge circuit 35 electrically connects to each of the phases A, B, and C of the multiphase electric machine 10. The rectifying bridge circuit 35 includes a plurality of switch devices 37, shown as three pairs of switch devices 37 associated with corresponding phases A, B, C of the illustrated multiphase electric machine 10. Each of the switch devices 37 preferably includes a semi-conductor device having low-on impedance, e.g., in an order of magnitude of milli-Ohms. One exemplary switch device 37 includes a field-effect transistor device. In one embodiment this can be a MOSFET device. Alternatively, the switch devices 37 can include IGBT devices, JFET devices and other devices. The pairs of switch devices 37 are configured to control electric power flow between the positive DC electric power bus 40 and one of the plurality of electric cables 34A, 34B, and 34C of the AC electric circuit 32 associated with one of the phases A, B, C of the multiphase electric machine 10, and the negative DC electric power bus 45. A control module 20 includes a switch control circuit to control activation and deactivation of each of the switch devices 37.

The inverter circuit 30 includes a resistor shunt circuit 50 including first and second high impedance resistors 52 and 54 that are electrically connected in series between the positive DC electric power bus 40 and the negative DC electric power bus 45. The junction 56 between the first and second high impedance resistors 52 and 54 is electrically connected to a chassis ground 25. The high-voltage energy storage device 15 electrically connects to the positive DC electric power bus 40 and the negative DC electric power bus 45 such that the DC input voltages float with reference to the chassis ground 25, and is controlled using the first and second high impedance resistors 52 and 54. Preferably, half the DC bus voltage is applied across the positive DC electric power bus 40 to the chassis ground 45, and half the DC bus voltage is applied across the negative DC electric power bus 45 to the chassis ground 25.

The inverter circuit 30 includes a capacitive shunt circuit 60 electrically connected in parallel with the rectifying bridge circuit 35 between the positive DC electric power bus 40 and the negative DC electric power bus 45. The capacitive shunt circuit 60 provides low impedance shunt paths for high frequency noise currents. In one embodiment, the capacitive shunt circuit 60 includes a first capacitor 62 that is electrically connected in parallel to a circuit that includes a plurality of capacitors 64 that form an H-bridge circuit with a shunt resistor 66 connected therebetween. The capacitors 64 are precision capacitors preferably having equal capacitance ratings that are sized in conformance with electric power transferred between the positive DC electric power bus 40 and the negative DC electric power bus 45. In one embodiment the capacitors 64 are rated at 2 µF, 10%, 1200V. Two of the capacitors 64 and a first lead of the shunt resistor 66 form a first node or junction 68 which electrically connects to the chassis ground 25. A second junction 69 is formed between two other of the capacitors 64 and a second lead of the shunt resistor 66.

The capacitive shunt circuit 60 is a snubber circuit intended to suppress transient electric voltage and current during ongoing operation. Voltage suppression can be accomplished by storing electric energy in the first capacitor 62 and capacitors 64 during one portion of an operating cycle and discharging the electric energy during a second portion of the operating cycle. Preferably each of the capacitors 62 and 64 are Y-capacitors that shunt common-mode electrical noise current. Known Y-capacitors contain a dielectric having self-healing properties to suppress and prevent current leakage therethrough and prevent an associated ground fault.

When a fault occurs causing an electric short between the chassis ground 25 and any one of the inverter circuit 30, the electric cables 34A, 34B, and 34C, and the electric machine 10, AC electric power measurable as AC electric current can flow through the capacitive shunt circuit 60 to the chassis ground 25. The electric power flow can be dissipated in the form of electrical heating to one or more components associated with the inverter circuit 30, the electric cables 34A, 34B, and 34C, and the electric machine 10. An electric current associated with a fault that flows through the capacitive shunt circuit 60 to the chassis ground 25 can be measured in the capacitive shunt circuit 60.

The AC current transducer 70 is integrated into the capacitive shunt circuit 60 to continuously and preferably directly measure electric current passing through the capacitive shunt circuit 60 to the chassis ground 25. In one embodiment, the AC current transducer 70 is configured to measure electric current passing between the first junction 68 and the chassis ground 25. Alternatively, the AC current transducer 70 is configured to continuously measure electric current passing between the first junction 68 and the second junction 69 through the shunt resistor 66. Preferably the AC current transducer 70 and related measurement circuitry are directly integrated into an electronic circuit board for the inverter circuit 30 including the capacitive shunt circuit 60.

The AC current transducer 70 preferably includes a Rogowski current transducer printed on an integrated circuit board including an aperture through which an electric cable that connects between the first junction 68 and the chassis ground 25 passes. Alternatively, the AC current transducer 70 includes a Rogowski coil that physically encircles the shunt resistor 66 connecting the first junction 68 and the second junction 69, all of which are contained on a printed wiring board (PWB). In either embodiment, the AC current transducer 70 continuously measures AC electric current flowing through the capacitive shunt circuit 60 to the chassis ground 25.

The AC current transducer 70 including the Rogowski current transducer continuously generates an analog voltage signal that directly corresponds to the magnitude of AC electric current flowing through the capacitive shunt circuit 60 to the chassis ground 25. In one embodiment, the rate of change of the AC electric current being monitored through the AC current transducer 70 induces a voltage signal output in a range of 1 mV/Amp. A signal processing circuit can condition the output signal based upon an expected range of voltages associated with the AC electric current. The AC current transducer 70 coupled to a signal processing circuit has a potential to measure a wide range of electric currents without saturating. Furthermore, the AC current transducer 70 has a wide bandwidth that is in a range between 0.1 Hz and 17 MHz with minimal attenuation in one embodiment. The AC current transducer 70 is electrically isolated from the capacitive shunt circuit 60. In one embodiment the AC current transducer 70 and associated signal processing circuit measures AC current changes at a rate of 40,000 A/μS.

The AC current transducer 70 for monitoring the capacitive shunt circuit 60 is configured to measure the flow of AC electric current without concern or interference from any DC electric current on which the AC electric current may be superimposed. Because the capacitive shunt circuit 60 includes capacitors connected in series, there is minimal or no DC current flowing to the chassis ground 25 when there is no fault in operation of the electric machine 10 associated with a loss of electric ground isolation. However, when a fault occurs causing an electric short between the chassis ground 25 and any one of the inverter circuit 30, the electric cables 34A, 34B, and 34C, and the electric machine 10, i.e., a loss of ground isolation, AC current can be present on one of the positive DC electric power bus 40 and the negative DC electric power bus 45, and will pass through the capacitors 62, 64 of the capacitive shunt circuit 60.

Figure 2:
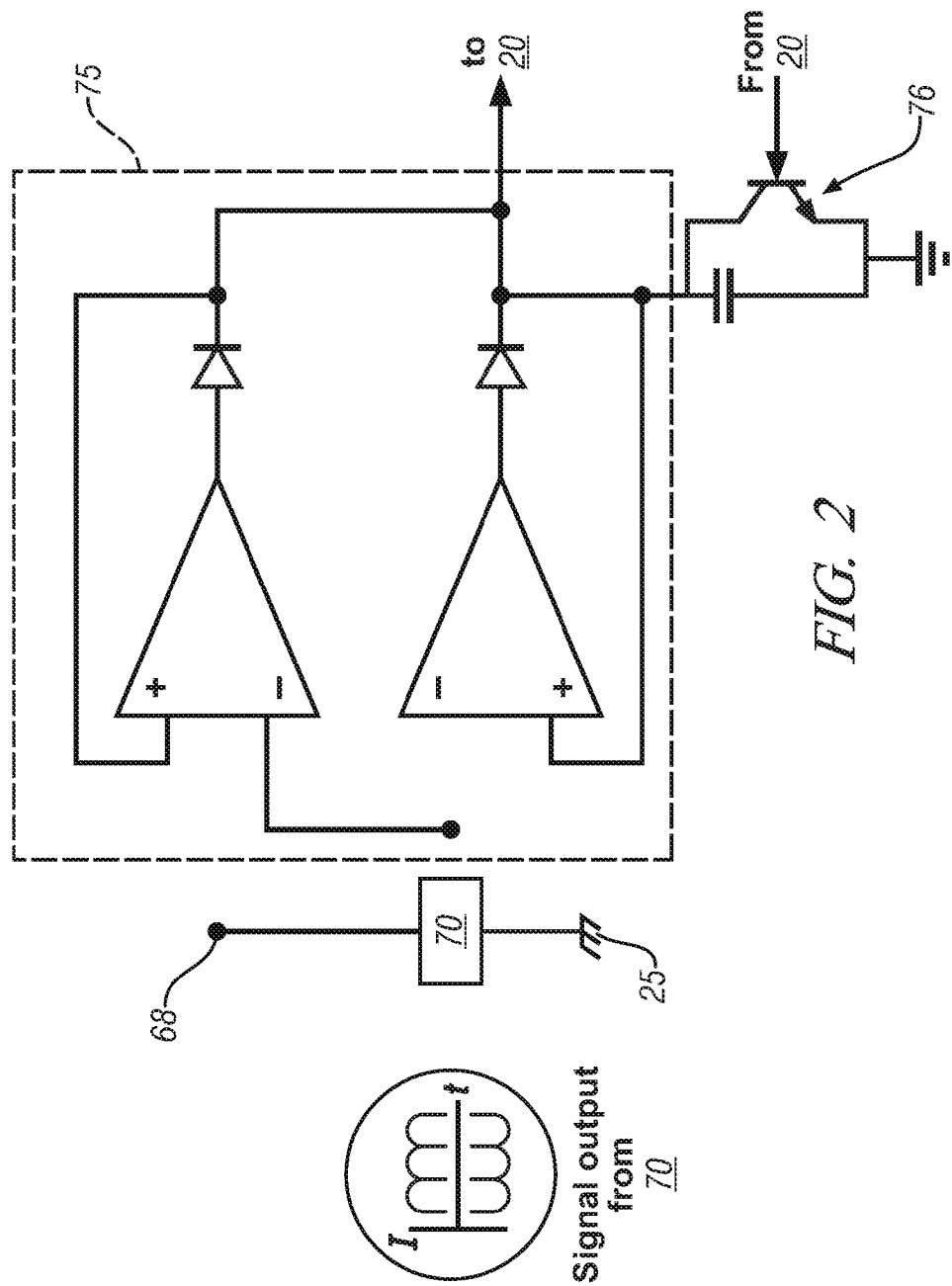
FIG. 2 shows a schematic of an electronic circuit including the AC current transducer signally connected to a peak-and-hold monitoring circuit in accordance with the present disclosure.

FIG. 2 schematically shows an electronic circuit including the AC current transducer 70 signally connected to a peak-and-hold monitoring circuit 75 including a reset circuit 76. The schematic is illustrative. The peak-and-hold monitoring circuit 75 monitors magnitude of AC electric current output from the AC current transducer 70 and detects a maximum magnitude of the flow of AC electric current in both the positive current direction and the negative current direction. The peak-and-hold monitoring circuit 75 generates a signal output that is communicated to an input connection of the control module 20. The control module 20 monitors the signal output from the peak-and-hold monitoring circuit 75. When the signal output from the peak-and-hold monitoring circuit 75 exceeds a predetermined threshold, either positive or negative, the control module 20 controls the inverter circuit 30 to interrupt the flow of electric current between the AC electric circuit 32 and the electric machine 10, thus discontinuing operation of the multiphase electric machine 10. Operation of the multiphase electric machine 10 is preferably discontinued for a predetermined period of time associated with fault mitigation. The control module 20 also sends a signal to the reset circuit 76 to reset the peak-and-hold monitoring circuit 75 and begin a new monitoring cycle. A ground isolation fault associated with one of the AC electric circuit 32 and the multiphase electric machine 10 is identified when the maximum magnitude of AC electric current flow exceeds a predetermined threshold. Thus, the control module 20 is able to detect a peak AC current flow using digital sampling by monitoring output from the peak-and-hold monitoring circuit 75 signally connected to the AC current transducer 70.

Control module, module, controller, processor and similar terms mean any suitable one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs, combinational logic circuit(s), input/output circuit(s) and devices, appropriate signal conditioning and buffer circuitry, and other suitable components to provide the described functionality. The control module has a set of control algorithms, including resident software program instructions and calibrations stored in memory and executed to provide the desired functions. The algorithms are preferably executed during preset loop cycles. Algorithms are executed, such as by a central processing unit, and are operable to monitor inputs from sensing devices and other networked control modules, and execute control and diagnostic routines to control operation of actuators. Loop cycles may be executed at regular intervals, for example each 3.125, 6.25, 12.5, 25 and 100 milliseconds during ongoing engine and vehicle operation. Alternatively, algorithms may be executed in response to occurrence of an event.

The inverter circuit 30 including the rectifying bridge circuit 35, the resistor shunt circuit 50, and the capacitive shunt circuit 60 can each be implemented as an assembly of discrete elements or preferably as an application-specific integrated circuit (ASIC).

A fault in the inverter circuit 30 can be located and isolated to a specific one of the circuits configured to transfer and convert high-voltage DC electric power from the high-voltage energy storage device 15 to high-voltage AC electric power that is transferred to the electric machine 10. This includes selectively activating, i.e., repetitively switching one of the switch devices 37 of the inverter circuit 30 on and off, and monitoring electric current using the AC current transducer 70 in combination with the phase current sensors 36, and also monitoring voltages on the positive DC electric power bus 40 and the negative DC electric power bus 45.

If there is no fault, no current flow will be detected across the AC current transducer 70. If a fault has cleared, i.e., is no longer present, no current flow will be detected across the AC current transducer 70. If there is a fault in the circuit 35, but there is no fault in the circuit associated with the activated switch device 37, low current flow with a low frequency signal may be detected across the AC current transducer 70. If there is a fault in the circuit 35 and in the circuit associated with the activated switch device 37, a high current flow with a high frequency signal will be detected across the AC current transducer 70. If the fault is associated with one of the positive DC electric power bus 40 and the negative DC electric power bus 45, the ground fault can be detected by monitoring voltage between the positive DC electric power bus 40 and the chassis ground 25 and monitoring the voltage between the negative DC electric power bus 45 and the chassis ground 25 to detect fault in isolation of the chassis ground 25.

Figure 3:
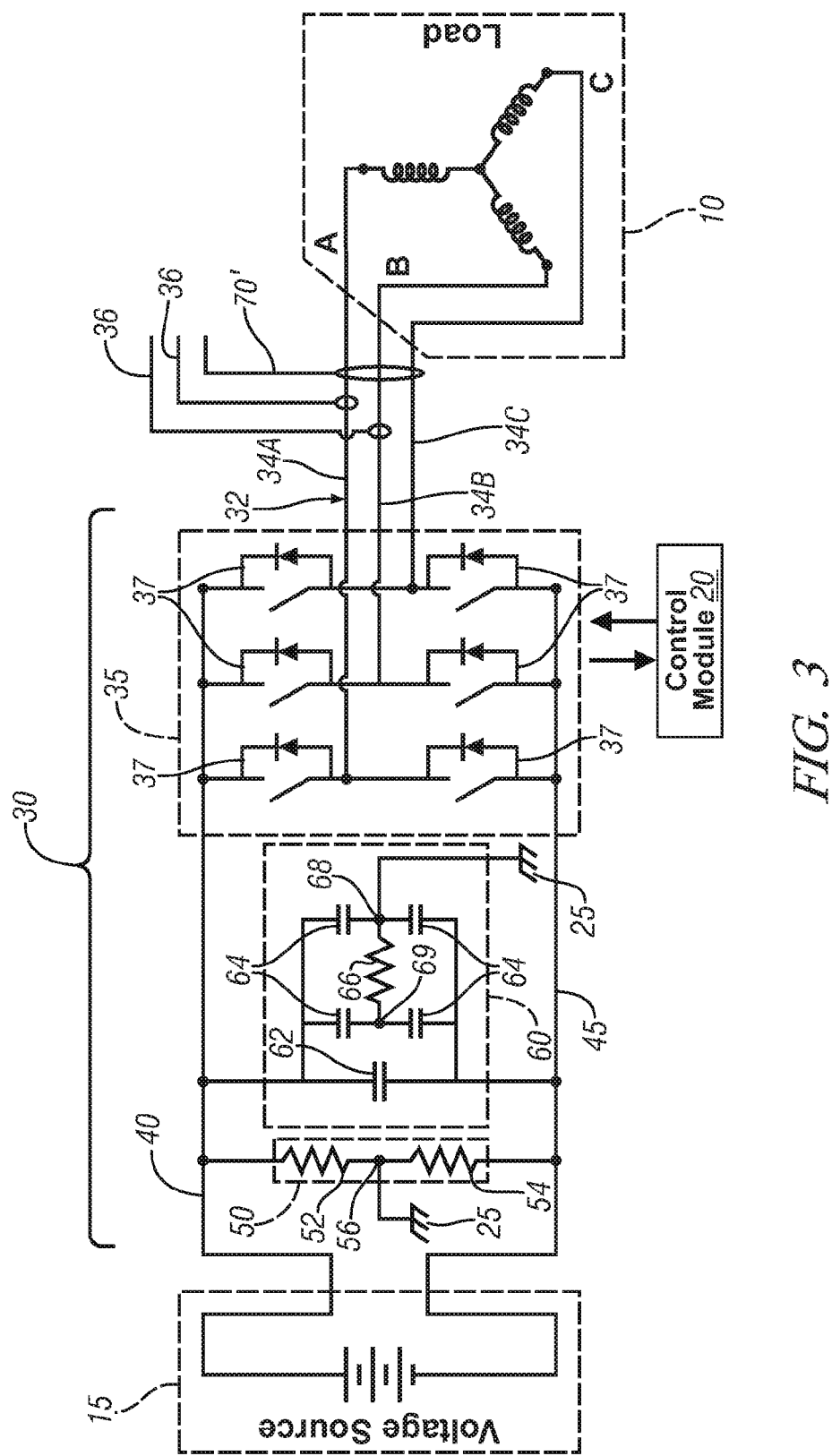
FIG. 3 schematically illustrates an electric motor control circuit including an inverter circuit configured to transfer and convert high-voltage direct-current (DC) electric power from a high-voltage energy storage device to high-voltage alternating current (AC) electric power that is transferred to an electric machine, in accordance with the present disclosure.

FIG. 3 schematically illustrates another embodiment of the electric motor control circuit including the inverter circuit 30 configured to transfer and convert high-voltage DC electric power from the high-voltage energy storage device 15 to high-voltage AC electric power that is transferred to the electric machine 10. The high-voltage energy storage device 15 electrically connects to the inverter circuit 30 via the positive DC electric power bus 40 and the negative DC electric power bus 45. The inverter circuit 30 electrically connects to the electric machine 10 via the AC electric circuit 32 including a wiring harness including a plurality of electric cables 34A, 34B, and 34C, wherein the electric cables 34A, 34B, and 34C electrically connect to individual phases of the multiphase electric machine 10. Phase current sensors 36 are configured to sense and thus monitor electric current flowing through two of the three electric cables 34, e.g., cables 34A and 34B. An AC current transducer 70 is configured to monitor AC current through the AC electric circuit 32 including the wiring harness including the plurality of electric cables 34A, 34B, and 34C electrically connected to phases of the multiphase electric machine 10.

During normal operation, the switch devices 37 of the inverter circuit 30 are controlled to control electric current flow between the high-voltage energy storage device 15 and the electric machine 10 via the positive DC electric power bus 40 and the negative DC electric power bus 45. The phase current sensors 36 monitor electric current flowing through two of the three electric cables 34, e.g., cables 34A and 34B and the AC current transducer 70 measures overall AC current flowing through all the individual electric cables of the AC electric circuit 32.

A ground isolation fault results in a deviation in the overall AC current flowing through the AC electric circuit 32 that can be detected using the AC current transducer 70'. Depending upon the location of a ground isolation fault, signal outputs from the signal outputs of the phase current sensors 36 and the AC current transducer 70 can be used to detect the fault. This includes detecting a ground isolation fault that results in a common-mode current in two or more of the electric cables 34A, 34B, and 34C.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. Method to control an electric motor control circuit including an electric energy storage device electrically connected via a positive DC electric power bus and a negative DC electric power bus to an inverter circuit, the inverter circuit electrically connected via an alternating current circuit to an electric machine, the method comprising:
   controlling the inverter circuit to control electric current flow between the alternating current circuit and the electric machine;
   continuously monitoring AC electric current flow through a capacitive shunt circuit electrically connected between the positive DC electric power bus and the negative DC electric power bus, the capacitive shunt circuit including a node electrically coupled to a chassis ground;
   detecting a fault associated with one of the alternating current circuit and the electric machine when the AC electric current flow through the capacitive shunt circuit exceeds a predetermined threshold; and
   controlling the inverter circuit to interrupt the flow of electric current between the alternating current circuit and the electric machine in response to a detected fault.

2. The method of claim 1, wherein continuously monitoring AC electric current flow comprises a peak and hold current monitoring to continuously monitor the AC electric current flow through the capacitive shunt circuit to determine a maximum magnitude of the AC electric current flow through the capacitive shunt circuit.

3. The method of claim 2, wherein detecting a fault associated with one of the alternating current circuit and the electric machine comprises the maximum magnitude of the AC electric current flow through the capacitive shunt circuit exceeding the threshold.

4. The method of claim 3, wherein controlling the inverter circuit to interrupt the flow of electric current between the alternating current circuit and the electric machine comprises controlling the inverter circuit to interrupt the flow of electric current between the alternating current circuit and the electric machine for a predetermined fault mitigation time period.

5. The method of claim 1, wherein continuously monitoring AC electric current flow through a capacitive shunt circuit electrically connected between the positive DC electric power bus and the negative DC electric power bus comprises continuously monitoring a signal output of a current transducer monitoring the AC electric current flow through the capacitive shunt circuit.

6. The method of claim 5, wherein the current flow through the capacitive shunt circuit electrically connected between the positive DC electric power bus and the negative DC electric power bus comprises an AC electric current flow through a shunt resistor of the capacitive shunt circuit.

7. The method of claim 5, wherein the current flow through the capacitive shunt circuit electrically connected between the positive DC electric power bus and the negative DC electric power bus comprises an AC electric current flow through the node of the capacitive shunt circuit electrically connected to the chassis ground.

8. The method of claim 1, wherein continuously monitoring AC electric current flow through the capacitive shunt circuit electrically connected between the positive DC electric power bus and the negative DC electric power bus comprises continuously monitoring a signal output of a Rogowski current transducer moniroring the flow of AC electric current through the capacitive shunt circuit.

9. The method of claim 1, wherein detecting a fault associated with one of the alternating current circuit and the electric machine when the AC electric current flow through the capacitive shunt circuit exceeds a predetermined threshold comprises detecting a fault associated ground isolation of one of the alternating current circuit and the electric machine.

10. Method to monitor electrical ground isolation of an inverter circuit electrically connected to a multiphase electric machine via an alternating current circuit, the inverter circuit including a capacitive shunt circuit electrically connected in parallel with a rectifying bridge circuit between a positive DC electric power bus and a negative DC electric power bus, the method comprising:

electrically connecting the capacitive shunt circuit to a chassis ground;

controlling the rectifying bridge circuit to control alternating current flow to the multiphase electric machine;

continuously monitoring magnitude of AC electric current flow through the capacitive shunt circuit to the chassis ground; and detecting a ground isolation fault associated with one of the inverter circuit, the AC electric circuit and the multiphase electric machine when the magnitude of the AC electric current flow through the capacitive shunt circuit to the chassis ground exceeds a predetermined threshold.

11. The method of claim 10, wherein continuously monitoring magnitude of AC electric current flow through the capacitive shunt circuit to the chassis ground comprises continuously monitoring a signal output of a current transducer.

12. The method of claim 11, wherein continuously monitoring a signal output of the current transducer comprises continuously monitoring a signal output of a Rogowski current transducer.

13. The method of claim 10, comprising controlling the rectifying bridge circuit of the inverter circuit to interrupt the electric current flow between the alternating current circuit and the multiphase electric machine in response to the detected ground isolation fault.

14. The method of claim 12, comprising detecting a ground isolation fault associated with the inverter circuit and the multiphase electric machine when a peak magnitude of the AC electric current flow through the capacitive shunt circuit to the chassis ground exceeds the predetermined threshold.

15. The method of claim 12, further comprising controlling the inverter circuit to interrupt the alternating current flow between the alternating current circuit and the multiphase electric machine for a predetermined period of fault mitigation time when a ground isolation fault is detected.

16. The method of claim 10, wherein monitoring the magnitude of AC current flow through the capacitive shunt circuit to the chassis ground comprises monitoring the AC current through a shunt resistor device of the capacitive shunt circuit.

17. Method to control an electric motor control circuit including an electric energy storage device electrically connected via a positive DC electric power bus and a negative DC electric power bus to an inverter circuit, the inverter circuit electrically connected via an alternating current circuit to an electric machine, the method comprising:

controlling the inverter circuit to control electric current flow between the alternating current circuit and the electric machine;

continuously monitoring AC current flow through a capacitive shunt circuit electrically connected between the positive DC electric power bus and the negative DC electric power bus, the capacitive shunt circuit electrically connected to a chassis ground;

detecting a maximum magnitude of the AC current flow through the capacitive shunt circuit with a peak and hold current monitor; and detecting a ground isolation fault associated with the inverter circuit and the electric machine when the maximum magnitude of the AC current flow through the capacitive shunt circuit exceeds a predetermined threshold.

* * * * *